(12) United States Patent
Schultz et al.

(10) Patent No.: US 9,024,474 B2
(45) Date of Patent: May 5, 2015

(54) UPS MECHANICAL TRANSFER RELAY ARC MITIGATION

(75) Inventors: Lynn Ernest Schultz, Nashua, NH (US); Noah L. Pendleton, Woburn, MA (US); Vishwas Mohaniraj Deokar, Acton, MA (US)

(73) Assignee: Schneider Electric It Corporation, West Kingston, RI (US)

( * ) Notice: Subject to any disclaimer, the term of this patent is extended or adjusted under 35 U.S.C. 154(b) by 885 days.

(21) Appl. No.: 13/197,509

(22) Filed: Aug. 3, 2011

(65) Prior Publication Data

US 2013/0033109 A1    Feb. 7, 2013

(51) Int. Cl.
*H02J 9/00* (2006.01)
*H02J 9/06* (2006.01)
*H03K 17/13* (2006.01)

(52) U.S. Cl.
CPC .............. *H02J 9/062* (2013.01); *H03K 17/13* (2013.01)

(58) Field of Classification Search
CPC ................................ H02J 9/062; H03K 17/13
USPC .......................................................... 307/64
See application file for complete search history.

(56) References Cited

U.S. PATENT DOCUMENTS

| | | |
|---|---|---|
| 4,560,886 A | 12/1985 | Ferguson |
| 4,703,191 A | 10/1987 | Ferguson |
| 4,763,013 A | 8/1988 | Gvoth, Jr. et al. |
| 5,241,217 A | 8/1993 | Severinsky |
| 5,267,120 A | 11/1993 | Graff et al. |
| 5,289,046 A | 2/1994 | Gregorich et al. |
| 5,410,193 A | 4/1995 | Backus et al. |
| 5,465,011 A | 11/1995 | Miller et al. |
| 5,541,828 A | 7/1996 | Rozman |
| 5,559,685 A | 9/1996 | Lauw et al. |
| 5,579,197 A * | 11/1996 | Mengelt et al. .............. 361/93.4 |
| 5,684,688 A | 11/1997 | Rouaud et al. |
| 6,046,920 A | 4/2000 | Cazabat et al. |
| 6,181,028 B1 * | 1/2001 | Kern et al. ...................... 307/64 |
| 6,353,547 B1 | 3/2002 | Jang et al. |
| 6,757,185 B2 | 6/2004 | Rojas Romero |
| 6,838,925 B1 | 1/2005 | Nielsen |

(Continued)

OTHER PUBLICATIONS

International Search Report and Written Opinion from PCT/US2012/049285 mailed Oct. 26, 2012.

*Primary Examiner* — Rexford Barnie
*Assistant Examiner* — Toan Vu
(74) *Attorney, Agent, or Firm* — Lando & Anastasi, LLP

(57) ABSTRACT

Systems and methods of providing power with an uninterruptible power supply are provided. The uninterruptible power supply includes a first input to receive an input AC voltage from a power source, the input AC voltage having an associated phase angle, and a second input to receive an input voltage from a backup power source. The uninterruptible power supply also includes an output. The output provides output power derived from power from at least one of the power source and the backup power source. The uninterruptible power supply also includes an inverter coupled to the backup power source, a relay and a controller. The relay is configured to couple the first input with the output in a first position, and to couple the inverter with the output in a second position. The controller is configured to detect a voltage swell condition of the input voltage, and responsive to detection of the voltage swell condition, control the relay to switch from the first position to the second position during a predefined range of phase angles of the input AC voltage.

20 Claims, 3 Drawing Sheets

(56) References Cited

U.S. PATENT DOCUMENTS

| | | |
|---|---|---|
| 7,142,950 B2 | 11/2006 | Rasmussen et al. |
| 2002/0130556 A1 | 9/2002 | Hohri |
| 2003/0227785 A1 | 12/2003 | Johnson |
| 2005/0036253 A1 | 2/2005 | Tian et al. |
| 2006/0138867 A1* | 6/2006 | Tian et al. .................. 307/65 |
| 2007/0018506 A1 | 1/2007 | Paik et al. |
| 2009/0236913 A1* | 9/2009 | Mariasis et al. ............ 307/66 |

* cited by examiner

UPS MECHANICAL TRANSFER RELAY ARC MITIGATION

BACKGROUND

1. Field of Invention

At least one embodiment of the present invention relates generally to systems and methods of providing uninterruptible power, and more specifically, to control of an uninterruptible power supply.

2. Discussion of Related Art

Uninterruptible power supplies (UPS) are used to provide reliable power to many different types of electronic equipment. Uninterruptible power supplies regulate power provided to a load, and can provide backup power to a load in the event of a loss of primary power, such as during black out or brown out conditions. Unwanted fluctuations in input power provided to the uninterruptible power supply can waste energy and damage electrical equipment, which results in increased cost, a loss of productivity and can require repair or replacement of electrical components.

SUMMARY OF THE INVENTION

Aspects and embodiments of the present invention are directed to systems and methods of providing uninterruptible power with an uninterruptible power supply. The uninterruptible power supply receives power at an input and provides power at an output. The uninterruptible power supply also includes an inverter and relays configured to selectively couple the input with the output in one configuration, and the inverter with the output in another configuration. The uninterruptible power supply further includes a controller that can detect a voltage swell condition, such as an increase in the input voltage received at the input of the uninterruptible power supply. Based on the voltage swell condition, the controller regulates switching of the relays to prevent inverter backfeed and to provide power at the uninterruptible power supply output.

At least one aspect is directed to an uninterruptible power supply. The uninterruptible power supply includes a first input configured to receive an input AC voltage from a power source, the input AC voltage having an associated phase angle. A second input is configured to receive an input voltage from a backup power source, and an output is configured to provide output power derived from power from at least one of the power source and the backup power source. The uninterruptible power supply also includes an inverter coupled to the backup power source, and a relay configured to couple the first input with the output in a first position, and to couple the inverter with the output in a second position. The uninterruptible power supply also includes a controller configured to detect a voltage swell condition of the input voltage. Responsive to detection of the voltage swell condition, the controller controls the relay to switch from the first position to the second position during a predefined range of phase angles of the input AC voltage.

In some embodiments, responsive to detection of the voltage swell condition, the controller controls the relay to switch from the first position to the second position during a predetermined time period before a zero crossing of the input voltage. The controller can control the relay to switch from the first position to the second position between 6.3 ms and 3.1 ms before a zero crossing of the input voltage.

In one embodiment, the first input includes an input line and a neutral line to receive the input AC voltage from the power source. The relay couples the input line and the neutral line with the output in the first position, and couples the input line and the neutral line with the inverter in the second position. In some embodiments, the inverter includes a DC bus line, and the controller controls switching of the relay to maintain a substantially constant voltage of the DC bus line during the voltage swell condition. The controller samples the input AC voltage and compares the sampled input AC voltage with a reference voltage to detect the voltage swell condition. In one embodiment, the controller samples the input AC voltage to determine a plurality of sampled input AC voltage values, and detects the voltage swell condition based on at least two of a group of four consecutive sampled input AC voltage values being above a reference voltage.

At least one other aspect is directed to a method of distributing uninterruptable power using an uninterruptible power supply having an input, an output, an inverter, and a relay. The relay couples the input with the output in a first position, and couples the inverter with the output in a second position. The method includes an act of receiving an input voltage from a power source and an act of detecting a voltage swell condition of the input voltage. Responsive to the detection of the voltage swell condition, the method includes an act of identifying a phase angle of the input voltage to initiate a switching operation of the relay between the first position and the second position. The method also includes an act of switching the relay from the first position to the second position at the phase angle of the input voltage.

In some embodiments, the method includes acts of delaying, responsive to the detection of the voltage swell condition, the act of switching the relay from the first position to the second position until a predetermined time period before a zero crossing of the input voltage, and an act of switching the relay from the first position to the second position during the predetermined time period. In one embodiment, the inverter includes a DC bus line, and the method controls switching of the relay between the first position and the second position to maintain a substantially constant voltage of the DC bus line during the voltage swell condition. In some embodiments, the method includes acts of sampling the input voltage and comparing the sampled input voltage with a reference voltage to detect the voltage swell condition. In one embodiment, the method includes acts of sampling the input voltage to determine a plurality of sampled input voltage values, and detecting the voltage swell condition based on at least two of a group of four consecutive sampled input voltage values being above a reference voltage. The method can also include an act of switching the relay from the first position to the second position during a time period between detection of the voltage swell condition and a zero crossing of the input voltage.

At least one other aspect is directed to an uninterruptible power supply that includes a first input configured to receive an input AC voltage from a power source, the input AC voltage having an associated phase angle. A second input is configured to receive an input voltage from a backup power source. An output is configured to provide output power derived from power from at least one of the power source and the backup power source. The uninterruptible power supply also includes an inverter coupled to the backup power source, and a relay configured to couple the first input with the output in a first position, and to couple the inverter with the output in a second position. The uninterruptible power supply includes means for detecting a voltage swell condition of the input voltage, and responsive to detection of the voltage swell condition, controlling the relay to switch from the first position to the second position during a predefined range of phase angles of the input AC voltage.

In some embodiments, the uninterruptible power supply includes means for controlling the relay to switch from the first position to the second position during a predetermined time period before a zero crossing of the input voltage. The uninterruptible power supply can also include means for sampling the input AC voltage and comparing the sampled input AC voltage with a reference voltage to detect the voltage swell condition. In one embodiment, the first input includes an input line and a neutral line to receive the input AC voltage from the power source. The relay couples the input line and the neutral line with the output in a first position, and the relay couples the input line and the neutral line with the inverter in the second position. In one embodiment, the means for controlling the relay to switch includes means for providing a transfer command that instructs the relay to switch from the first position to the second position.

These and other aspects and embodiments are discussed in detail below. The foregoing information and the following detailed description include illustrative examples of various aspects and embodiments, and provide an overview or framework for understanding the nature and character of the claimed aspects and embodiments. The drawings provide illustration and a further understanding of the various aspects and embodiments, and are incorporated in and constitute a part of this specification. The drawings, together with the remainder of the specification, serve to describe and explain the claimed aspects and embodiments.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
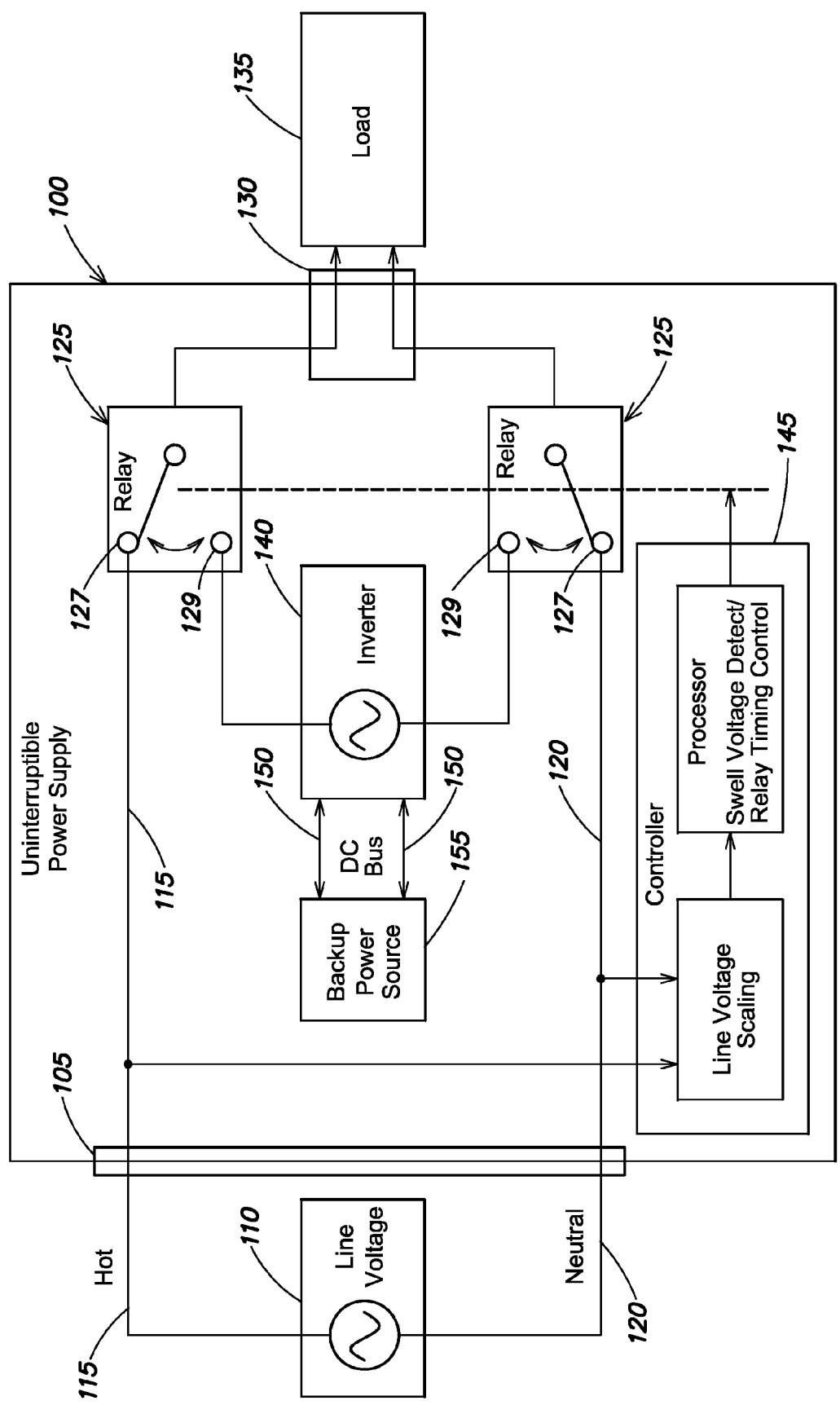
FIG. 1 is a schematic block diagram depicting an uninterruptible power supply in accordance with an embodiment.

The systems and methods described herein are not limited in their application to the details of construction and the arrangement of components set forth in the description or illustrated in the drawings. The invention is capable of other embodiments and of being practiced or of being carried out in various ways. Also, the phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate embodiments consisting of the items listed thereafter exclusively.

FIG. 1 is a diagram depicting an uninterruptible power supply (UPS) 100. In one embodiment, the uninterruptible power supply 100 is a line-interactive uninterruptible power supply, although other embodiments may be directed to other types of power supplies, such as online, standby, or double conversion uninterruptible power supplies. The uninterruptible power supply 100 includes an input 105 (e.g., main lines) to receive power from a power source 110. For example, an input line 115 and a neutral line 120 can receive AC power from the power source 110. In one embodiment, the input line 115 and the neutral line 120 are main lines of the uninterruptible power supply 100 configured to receive AC power from a power grid.

The uninterruptible power supply 100 also includes two relays 125. In one configuration, the relays 125 connect the input 105 with an output 130. For example, the relays 125 can be a switch having mechanical contacts to couple the input line 115 or the neutral line 120 with the output 130 to provide power at the output 130.

The uninterruptible power supply 100 also includes an inverter 140. In another configuration, the relays 125 couple the inverter 140 with the output 130 to provide power at the output 130. Power at the output 130 can be provided to a load 135. In one embodiment, backup power is provided to the inverter 140 from a backup power source 155 via DC bus lines 150.

The uninterruptible power supply 100 also includes a controller 145. In one embodiment, the controller controls operation of the uninterruptible power supply 100 including the switching of the relays 125. For example, the controller 145 can control the relays 125 to switch back and forth between a first position where the relays 125 electrically couple the input 105 with the output 130 and a second position where the relays 125 electrically couple the inverter 140 with the output 130 to operate in a backup mode of operation. In one embodiment, the controller 145 controls the relays 125 to switch simultaneously. FIG. 1 depicts the relays 125 in a first position coupling the input 105 with the output 130. The controller 145 can switch the relays 125 from this position to a second position that couples the inverter 140 with output 130. When the input AC power is acceptable (as determined by the controller 145), the uninterruptible power supply 100 operates from the input power. When the controller 145 detects an out of tolerance condition with the input power, the controller 145 controls the relays 125 to couple to the inverter 140 to operate the uninterruptible power supply 100 in the back up mode of operation. Out of tolerance conditions include at least, loss of input power, low voltage of the input power and high voltage of the input power.

During operation of the uninterruptible power supply 100, a voltage swell at the input 105 can establish an arc between the input 105 (e.g., the input line 115 or the neutral line 120) and the inverter 140. The arc occurs across at least one of the relays 125, and provides a low impedance path between the input 105 and the inverter 140. While arcing can occur with the relays 125 in the position shown in FIG. 1, arcing is more likely to occur and cause damage when the relays 125 are in the process of switching from the position shown in FIG. 1. This can cause current to backfeed into the inverter 140. For example, contacts of the relays 125 can carry the arc from the input line 115 or the neutral line 120 to the inverter 140 during switching. This can increase an inverter DC bus line voltage to an overvoltage state and damage semiconductors or other components of the inverter 140.

In one embodiment, the relays 125 are single pole double throw transfer relays susceptible to arcing between the normally open poles 127 and the normally closed poles 129. For example, the relays 125 may operate in a powered first position that couples the input 105 with the output 130 and an unpowered second position that couples the inverter 140 with the output 130. Further, the two relays 125 can be separate relays, or can be two switching components of a single relay, controlled by the controller 145.

In one embodiment, the controller 145 detects the voltage swell condition. For example, the controller 145 can include a processor (e.g., microprocessor) and a differential amplifier circuit. The differential amplifier circuit senses the input voltage potential between the input line 115 and the neutral line 120 and scales this line voltage to a level suitable for measurement by the processor. The controller 145 compares the measured voltage samples with a reference voltage. In one embodiment, the uninterruptible power supply 100 has a nominal input voltage of 120V and a reference voltage of 160V, above which a voltage swell condition is determined to exist. Other reference voltage values such as 143V, 155V, 165V, or 208V can be used in various embodiments. The reference voltages can be part of a reference voltage curve waveform stored in memory associated with the controller 145.

In one embodiment, the controller 145 repeatedly samples the input voltage. For example, the controller 145 can sample the input voltage at 64 evenly distributed times per line cycle to detect the voltage swell condition or any other out of tolerance condition that should result in switching of the relays 125 to operate the uninterruptible power supply 100 in the backup mode of operation. In this example, the voltage swell condition can initiate at any point in the line cycle. To prevent false sensing of a minor line swell voltage during the portion of the line cycle when the differential voltage between the scaled line voltage and the reference voltage is small, (e.g., near the zero crossing of the line and reference voltages), the line swell sensing in this example is restricted to between the $4^{th}$ and $28^{th}$ samples, and again between the $36^{th}$ and $60^{th}$ samples. The controller 145 may detect a voltage swell condition during either of these two periods by evaluating the voltages at one or more of these sample times.

In one embodiment, the controller 145 compares the reference voltage with a group of four voltages at four sample times. The group of samples may be consecutive or non-consecutive samples of the input voltage waveform line cycle. The controller 145 can determine that a voltage swell condition exists when a number of the group of measured line voltage samples is above the reference voltage. For example, the controller 145 can detect a voltage swell condition when any two of the group of four measured line voltage samples is above the reference voltage. The two samples that indicate a voltage swell condition may but need not be consecutive.

In one embodiment, when an out of tolerance condition is the result of a voltage swell, the controller 145 initiates the switching of the relays 125 when the input voltage waveform is approaching a zero crossing to reduce the possibility of arcing across the relays 125. Because zero crossings occur twice in a 360 degree line cycle of the input voltage, controlling the relays 125 to couple with the inverter 140 only at or near the zero crossings slows control of the inverter 140. This may be unsuitable for some applications where faster control of the inverter 140 is desirable, such as in voltage sag, brownout, or blackout conditions. Thus, in one embodiment, the controller 145 can detect a voltage swell condition and, responsive to the detection of the voltage swell condition, the controller 145 controls the relays 125 to delay switching until the input voltage approaches a zero crossing. In the absence of a voltage swell condition, the controller 145 can operate the relays 125 without this delay. In one embodiment, the delay responsive to a detected voltage swell condition is approximately one half cycle of the input voltage or less. The controller 145 can determine that the voltage swell condition is concluded and can again control the relays 125 without timing delays.

Voltage swells can occur for a number of reasons including due to a phase to ground fault on another phase of the input voltage. For example, when the uninterruptible power supply 100 is operated in a delta-grounded three phase system, a phase to ground fault can lead to a voltage swell of approximately 73% above nominal. In a wye-grounded system a fault can result in the input voltage being approximately 35% above nominal. In at least some embodiments, the controller 145 will detect each of these conditions and identify them as voltage swells.

Responsive to the detected voltage swell condition, the controller 145 can identify a phase angle of the input voltage, or its corresponding time relative to a zero crossing of the input voltage, to provide a transfer command to switch the relays 125. For example, responsive to a detected voltage swell the controller 145 can delay a transfer command until the nearer of the 79 degree point or 259 degree point in the input voltage waveform. The relays 125 in this example begin to open approximately 3 ms after the transfer command, when the input voltage is approaching the zero crossing. In this example, the relays 125 couple with the inverter 140 (e.g., close) approximately 4.5 ms after application of the transfer command.

In one embodiment, the controller 145 provides a transfer command to switch the relays 125 at any point within a time period measured relative to a zero crossing of the input voltage. Delays in operation of the relays 125 responsive to a command to switch are taken into account to determine the timing boundaries of this time period. For example, the controller 145 can provide the transfer command within 0.76 ms after detecting a voltage swell. The relays 125 begin to open 3.1 ms after the transfer command is provided, or 3.86 ms after the voltage swell condition is detected. (3.1+0.76=3.86 ms.) The relays can take 1.36 ms to switch positions. In this example, the relays 125 complete the switching operation 5.22 ms after the controller 145 detects the voltage swell. (0.76+3.1+1.36=5.22 ms). This is equal to 4.46 ms after the controller 145 provides the transfer command. (3.1+1.36=4.46 ms.)

In one embodiment with the above delays, the controller 145 prevents the relays 125 from initiating switching within 3.1 ms (e.g., the delay time of the relays 125) before a zero crossing of the input voltage. This is an example of a first or inner boundary of the time period relative to the zero crossing. Accounting for the delay time of the relays 125, this boundary ensures that the relays 125 begin a switching operation at or before the zero crossing to avoid out of tolerance conditions at the inverter 140. For example, the uninterruptible power supply 100 can operate at a 120V nominal input voltage and the controller 145 can detect a 208V voltage swell at a 290 degree phase angle. In this example, the controller 145 provides the transfer command no less than 3.1 ms before the zero crossing of the input voltage.

In one embodiment, the controller 145 prevents the relays 125 from initiating switching more than 6.3 ms before the zero crossing of the input voltage. This is an example of a second or outer boundary of the time period relative to the zero crossing. For example, the uninterruptible power supply 100 can operate at a 120V nominal input voltage and the controller can detect a 220V voltage swell at a 220 degree phase angle. In this example, the controller 145 provides the transfer command no more than 6.3 ms before the zero crossing of the input voltage. Controlling the relays 125 to switch within this outer boundary avoids out of tolerance conditions in the inverter 140 because, for example, the relays 125 complete their switching operation while the input voltage is too close to a zero crossing to cause arcing across the relays 125.

Thus, in one embodiment, the time period relative to the input voltage zero crossing where switching may occur is between 6.3 ms and 3.1 ms before the zero crossing. This timing window applies on either half cycle of the input voltage. These numbers and ranges are examples and approximations, (e.g., +/−10%) and the components of uninterruptible power supply 100 can have other delay, switching, and total relay response times above and below these examples. For example, the controller 145 can provide the transfer command more than 6.3 ms before a zero crossing, or less than 3.1 ms before a zero crossing under different operating conditions, such as with linear or nonlinear resistive loads above or below 1000 W, or at 50 Hz or 60 Hz line frequency operation.

Figure 2:
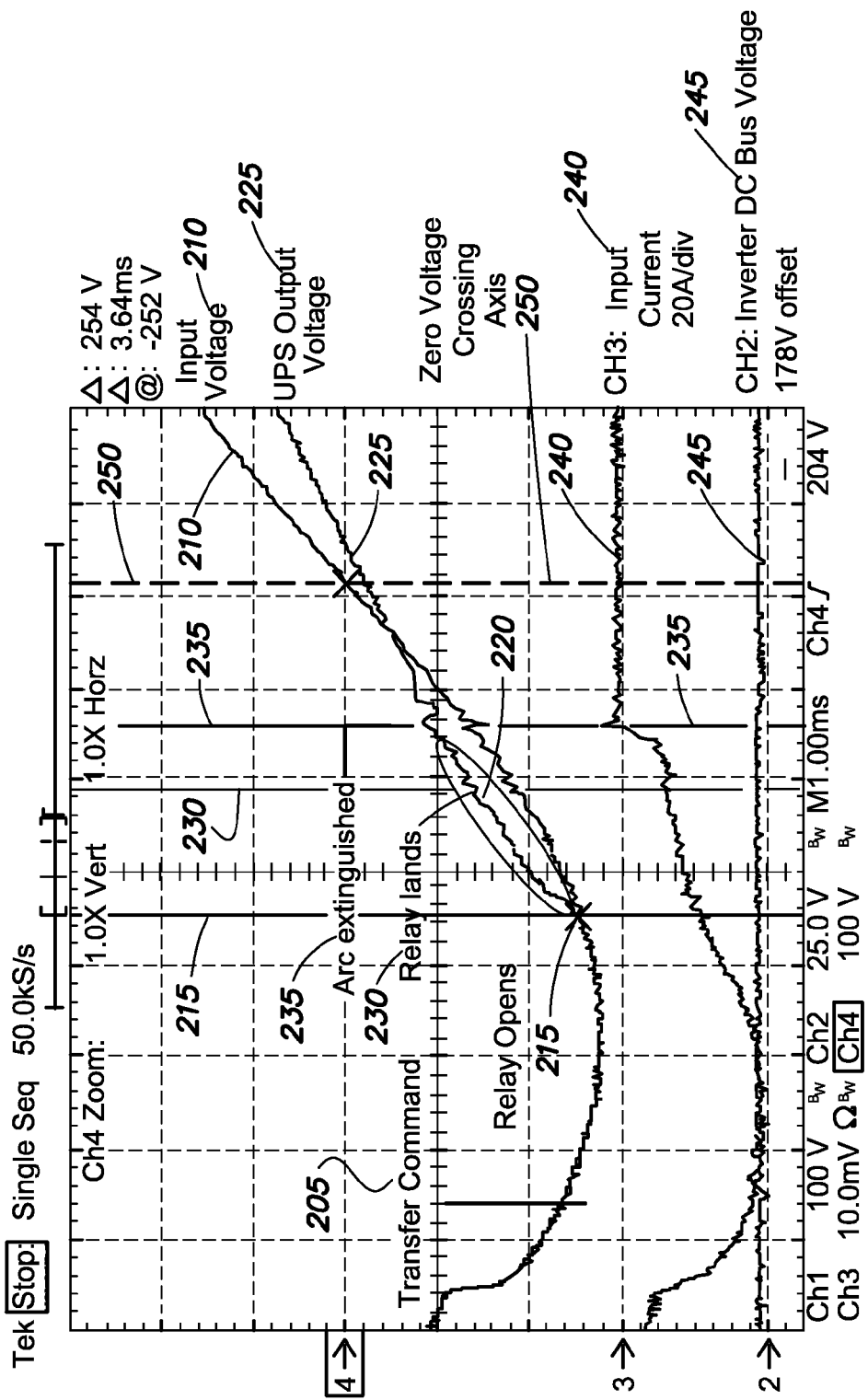
FIG. 2 is a graph depicting uninterruptible power supply characteristics responsive to a voltage swell condition in accordance with an embodiment.

FIG. 2 is a graph depicting waveforms of components of the uninterruptible power supply 100 during operation. With reference to FIG. 2, the uninterruptible power supply 100 is operating with a nominal input voltage of 120V and a 200V voltage swell condition occurs at 220 degrees in the input voltage waveform. The operating frequency of the uninterruptible power supply 100 in this example is 50 Hz, and the uninterruptible power supply 100 is operating with a 1000 W resistive load.

In the example of FIG. 2, the controller 145 provides the transfer command 205 at approximately the 238 degree phase angle of the input voltage waveform 210. After a delay of approximately 3 ms from the transfer command 205, the relays 125 open and begin their transition, indicated by the switch opening axis 215. (Although not directly depicted in FIG. 2, this occurs at 3.64 ms prior to the zero crossing in this example.) An arc is present when the relays 125 open, as indicated by the voltage decrease in the segment 220 of the UPS output voltage waveform 225. The relays 125 complete the transition at switch completion axis 230. (Although not directly depicted in FIG. 2, this occurs at 2.3 ms prior to the zero crossing in this example.) At this point the relays 125 are closed in their second position, and the arc extinguishes at the axis 235.

At the time instant corresponding to the axis 235, the voltage sag indicated by the segment 220 subsides and the input current indicated by the input current waveform 240 stabilizes. The arc extinguishes as the input voltage waveform 210 approaches a zero crossing, which is indicated by the zero voltage crossing axis 250. In this example, the energy transferred by the arc to the inverter 140 is below the tolerance level of the inverter 140 and does not impede operation of the uninterruptible power supply 100. This is indicated by the substantially constant inverter DC bus voltage 245, which remains constant at 178V in this example.

With reference to FIGS. 1 and 2, an arc remains across the relays 125 after they complete their switching at the axis 230. In other embodiments, the controller 145 provides the transfer command at a point in time closer to the zero crossing axis 250 than is depicted in FIG. 2. This occurs, for example, when the controller 145 provides the transfer command at the 259 degree phase angle (or 79 degree phase angle) of the input voltage waveform 210, as opposed to the 238 degree phase angle that generates the results depicted in FIG. 2. This moves the switch completion axis 230 closer to or beyond the arc extinguishing point of the axis 235. Thus, the arc can extinguish before or after the switching operation is completed.

Figure 3:
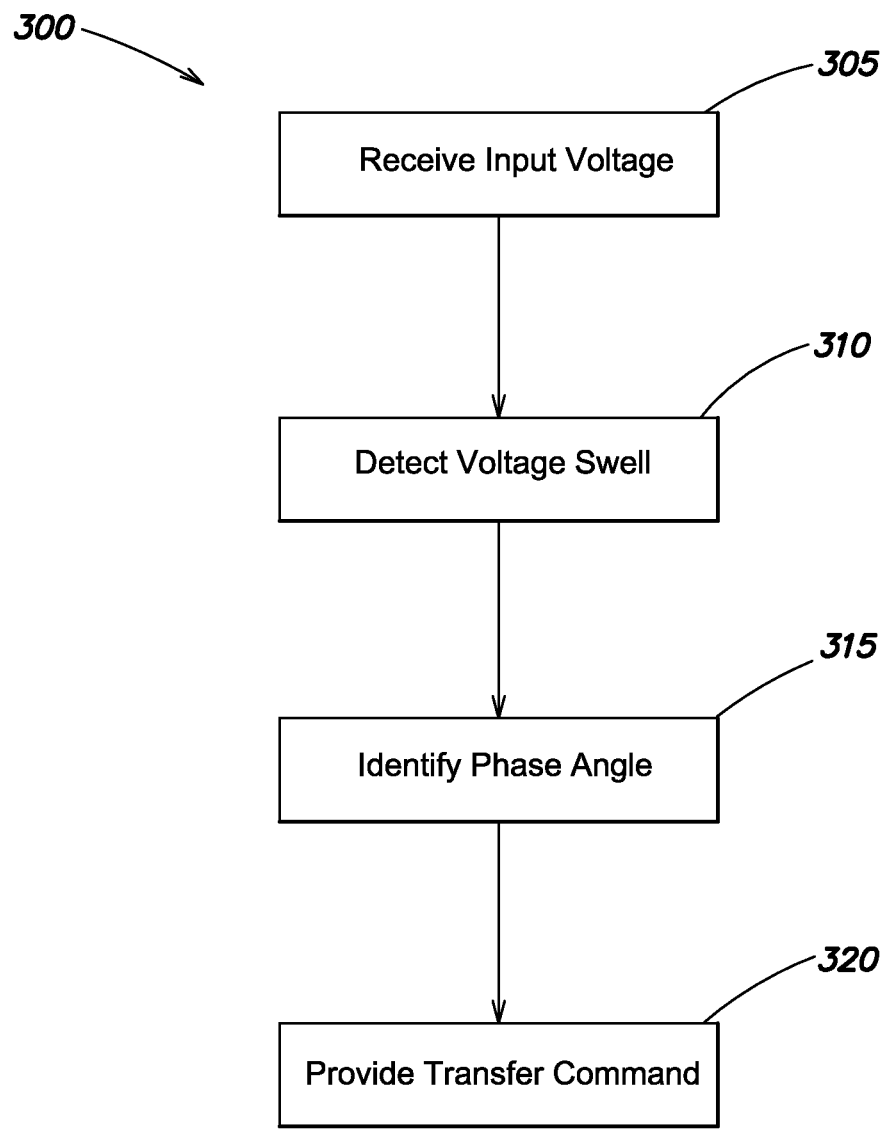
FIG. 3 is a flow chart depicting a method of providing uninterruptible power in accordance with an embodiment.

FIG. 3 depicts a method 300 of providing uninterruptible power. The method 300 provides uninterruptible power using an uninterruptible power supply having an input, output, inverter, and two relays. The relays can selectively couple the input or the inverter with the output. The method 300 includes an act of receiving an input voltage (ACT 305). In one embodiment, receiving the input voltage (ACT 305) includes receiving main line input voltage at an input of the uninterruptible power supply. The input voltage may be provided from a power source via a power grid. In one embodiment, the received input voltage has a nominal value of 120V.

The method 300 includes an act of detecting a voltage swell in the input voltage (ACT 310). In one embodiment, detecting the voltage swell (ACT 310) includes comparing at least one input voltage sample with a reference voltage. For example, a voltage swell can be detected when at least one measured or sampled input voltage value is greater than a reference value. In one embodiment, detecting the voltage swell (ACT 310) includes sampling the input voltage to determine a plurality of sampled input voltages, with the voltage swell being detected when at least two of the plurality of sampled input voltages are above a reference voltage, or outside of a tolerance range.

The method 300 also includes an act of identifying a phase angle of the input voltage at which to initiate a switching operation (ACT 315). The identified phase angle is the phase angle of the input voltage at which to provide a transfer command to initiate a switching operation. The phase angle can be identified responsive to detection of the voltage swell condition. In one embodiment, the identified phase angle is predetermined and programmed into firmware that operates the uninterruptible power supply. The phase angle of the input voltage may be identified (ACT 315) based on the corresponding time until the input voltage reaches a zero crossing. For example, identifying a phase angle (ACT 315) may include identifying a phase angle of the input voltage that occurs during a time period of between 6.3 ms and 3.1 ms before a zero crossing of the input voltage. The method 300 can also include an act of providing the transfer command (ACT 320). For example, the controller can provide the transfer command to one or more relays to begin a switching operation within a time period prior to a zero crossing of the input voltage.

Having now described some illustrative embodiments, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one embodiment are not intended to be excluded from a similar role in other embodiments.

Note that in FIGS. 1 through 3, the enumerated items are shown as individual elements. In actual implementations of the systems and methods described herein, however, they may be inseparable components of other electronic devices such as a digital computer. Thus, actions described above may be implemented at least in part in firmware or software that may be embodied in an article of manufacture that includes a program storage medium. The program storage medium can be a non-transitory medium and includes non-transitory and other data signals embodied in one or more of a carrier wave, a computer disk (magnetic, or optical (e.g., CD or DVD, or both)), non-volatile memory, tape, a system memory, and a computer hard drive. The program storage medium can include at least non-transient mediums, and the signals can include at least non-transient signals.

Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements to single or plural configurations. References to any act or element being based on any information, act or element may include embodiments where the act or element is based at least in part on any information, act, or element.

Any embodiment disclosed herein may be combined with any other embodiment, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. Such terms as used herein are not necessarily all referring to the same embodiment. Any embodiment may be combined with any other embodiment, inclusively or exclusively, in any manner consistent with the aspects and embodiments disclosed herein.

References to "or" may be construed as inclusive so that any terms described using "or" may indicate any of a single, more than one, and all of the described terms.

The systems and methods described herein may be embodied in other specific forms without departing from the characteristics thereof. For example, embodiments described herein are not limited to the uninterruptible power supplies, and may be used with other power supplies, converters, frequency converters, line conditioners, or other systems generally. The inputs and outputs as described herein may include multiple connections for respectively coupling to a voltage source and a load, and the control systems for uninterruptible power supplies may include more than one controller. The foregoing embodiments are illustrative rather than limiting of the described systems and methods. Scope of the systems and methods described herein is thus indicated by the appended claims, rather than the foregoing description, and changes that come within the meaning and range of equivalency of the claims are embraced therein.

What is claimed is:

1. An uninterruptible power supply, comprising:
   a first input configured to receive an input AC voltage from a power source, the input AC voltage having an associated phase angle;
   a second input configured to receive an input voltage from an inverter coupled to a backup power source;
   an output configured to provide output power derived from power from at least one of the power source and the backup power source;
   a relay configured to couple the first input with the output in a first position, to couple the inverter with the output in a second position, and to decouple the first input with the output in the second position;
   a controller configured to detect a voltage swell condition of the input voltage, and responsive to detection of the voltage swell condition, control the relay to switch from the first position to the second position during a predefined range of phase angles of the input AC voltage.

2. The uninterruptible power supply of claim 1, wherein, responsive to detection of the voltage swell condition, the controller is configured to control the relay to switch from the first position to the second position during a predetermined time period before a zero crossing of the input voltage.

3. The uninterruptible power supply of claim 1, wherein the controller is configured to control the relay to switch from the first position to the second position between 6.3 ms and 3.1 ms before a zero crossing of the input voltage.

4. The uninterruptible power supply of claim 1, wherein the controller controls the relay to switch from the first position to the second position.

5. The uninterruptible power supply of claim 1, wherein the first input includes an input line and a neutral line to receive the input AC voltage from the power source, and wherein the relay is configured to couple the input line and the neutral line with the output in the first position, and to couple the inverter with the output in the second position.

6. The uninterruptible power supply of claim 1, wherein the inverter includes a DC bus line, and wherein the controller is configured to control switching of the relay to maintain a substantially constant voltage of the DC bus line during the voltage swell condition.

7. The uninterruptible power supply of claim 1, wherein the controller is configured to sample the input AC voltage and to compare the sampled input AC voltage with a reference voltage to detect the voltage swell condition.

8. The uninterruptible power supply of claim 1, wherein the controller is configured to sample the input AC voltage to determine a plurality of sampled input AC voltage values, and to detect the voltage swell condition based on at least two of a group of four consecutive sampled input AC voltage values being above a reference voltage.

9. A method of distributing uninterruptable power using an uninterruptible power supply having an input, an output, an inverter, and a relay configured to couple the input with the output in a first position, to couple the inverter with the output in a second position, and to decouple the first input with the output in the second position, the method comprising:
   receiving an input voltage from a power source;
   detecting a voltage swell condition of the input voltage;
   responsive to the detection of the voltage swell condition, identifying a phase angle of the input voltage to initiate a switching operation of the relay between the first position and the second position; and
   switching the relay from the first position to the second position at the phase angle of the input voltage.

10. The method of claim 9, wherein switching the relay includes providing a transfer command within a time period of between 6.3 ms and 3.1 ms before a zero crossing of the input voltage.

11. The method of claim 9, further comprising:
    delaying, responsive to the detection of the voltage swell condition, the act of switching the relay from the first position to the second position until a predetermined time period before a zero crossing of the input voltage; and
    switching the relay from the first position to the second position during the predetermined time period.

12. The method of claim 9, wherein the inverter includes a DC bus line, further comprising:
    controlling switching of the relay between the first position and the second position to maintain a substantially constant voltage of the DC bus line during the voltage swell condition.

13. The method of claim 9, further comprising:
    sampling the input voltage; and
    comparing the sampled input voltage with a reference voltage to detect the voltage swell condition.

14. The method of claim 9, further comprising:
    sampling the input voltage to determine a plurality of sampled input voltage values; and
    detecting the voltage swell condition based on at least two of a group of four consecutive sampled input voltage values being above a reference voltage.

15. The method of claim 9, further comprising:
    switching the relay from the first position to the second position during a time period between detection of the voltage swell condition and a zero crossing of the input voltage.

16. An uninterruptible power supply, comprising:

a first input configured to receive an input AC voltage from a power source, the input AC voltage having an associated phase angle;

a second input configured to receive an input voltage from an inverter coupled to a backup power source;

an output configured to provide output power derived from power from at least one of the power source and the backup power source;

a relay configured to couple the first input with the output in a first position, to couple the inverter with the output in a second position, and to decouple the first input with the output in the second position; and means for detecting a voltage swell condition of the input voltage, and responsive to detection of the voltage swell condition, controlling the relay to switch from the first position to the second position during a predefined range of phase angles of the input AC voltage.

17. The uninterruptible power supply of claim 16, further comprising:

means for controlling the relay to switch from the first position to the second position during a predetermined time period before a zero crossing of the input voltage.

18. The uninterruptible power supply of claim 16, further comprising:

means for sampling the input AC voltage and comparing the sampled input AC voltage with a reference voltage to detect the voltage swell condition.

19. The uninterruptible power supply of claim 16, wherein the first input includes an input line and a neutral line to receive the input AC voltage from the power source, and wherein the relay is configured to couple the input line and the neutral line with the output in a first position, and to couple the inverter with the output in the second position.

20. The uninterruptible power supply of claim 16, wherein the means for controlling the relay to switch includes means for providing a transfer command that instructs the relay to switch from the first position to the second position.

\* \* \* \* \*